United States Patent
Park et al.

(10) Patent No.: US 8,139,426 B2
(45) Date of Patent: Mar. 20, 2012

(54) DUAL POWER SCHEME IN MEMORY CIRCUIT

(75) Inventors: Dongkyu Park, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 236 days.

(21) Appl. No.: 12/192,561

(22) Filed: Aug. 15, 2008

(65) Prior Publication Data

US 2010/0039872 A1   Feb. 18, 2010

(51) Int. Cl.
*G11C 7/00* (2006.01)

(52) U.S. Cl. .................. 365/189.11; 365/194; 365/226; 365/230.06

(58) Field of Classification Search ............. 365/189.11, 365/194, 230.06, 226
See application file for complete search history.

(56) References Cited

U.S. PATENT DOCUMENTS

| | | | |
|---|---|---|---|
| 6,621,745 B1 * | 9/2003 | Manea | 365/185.23 |
| 7,016,214 B2 * | 3/2006 | Kawamata et al. | 365/63 |
| 7,020,041 B2 * | 3/2006 | Somasekhar et al. | 365/229 |
| 7,345,946 B1 | 3/2008 | Chapman et al. | |
| 7,366,050 B2 * | 4/2008 | Kang et al. | 365/230.06 |
| 7,675,512 B2 | 3/2010 | Koyama et al. | |
| 2005/0002224 A1 | 1/2005 | Kawata et al. | |
| 2005/0180228 A1 * | 8/2005 | Canada et al. | 365/194 |

FOREIGN PATENT DOCUMENTS

EP   0991077   4/2000

OTHER PUBLICATIONS

Muhammad Khellah, "A 256-Kb Dual Vcc SRAM Building Block in 65-nm CMOS Process with Actively Clamped Sleep Transistor," IEEE Journal of Solid-State Circuits, vol. 41, No. 1, Jan. 2007.
International Search Report—PCT/US2009/053870, International Search Authority—European Patent Office Oct. 21, 2009.
Written Opinion—PCT/US2009/053870, International Search Authority—European Patent Office Oct. 21, 2009.

* cited by examiner

*Primary Examiner* — Pho M Luu
*Assistant Examiner* — Thao Bui
(74) *Attorney, Agent, or Firm* — Sam Talpalatsky; Nicholas J. Pauley; Johnathan T. Velasco

(57) ABSTRACT

A semiconductor memory device includes address signal level shifters configured to transform a low level address signal into a higher level address signal. A decoder is configured to receive the higher level address signal and, in response, provide word line signals. Write drivers receive low level data input signals and configure bitlines in response to the received input. Memory cells are responsive to the word line signals and to the configured bit lines for storing data therein.

30 Claims, 6 Drawing Sheets

DUAL POWER SCHEME IN MEMORY CIRCUIT

TECHNICAL FIELD

The disclosed embodiments relate generally to memory circuits. More specifically, the disclosure relates to memories having a dual power supply configuration.

BACKGROUND

As integrated memory circuits are scaled down to increase capacity it becomes desirable to reduce the power supply voltage. However, the memory cells (e.g., static random access memory or SRAM cells) and sense amplifiers (SA's) are very sensitive to reductions in the applied voltage. As the voltage is reduced, there is an increase in memory write and read errors due, for example, to ambiguity in the value of a charge stored by the memory cell, e.g., soft errors. To reduce power consumption and enable further reduction in circuit size, one approach is to reduce a voltage level supplied to circuits other than the memory cell array (e.g., decoders, clock circuits) while maintaining the voltage supplied to the memory cells at some desirable level. Even though the memory cells continue to be operated at the higher voltage and power levels, the net effect is to substantially reduce power consumption because the support circuits are continually operating while only a small number of the memory cells (e.g., only those actually being accessed) are fully powered at any particular time.

Implementing a sufficiently high voltage differential within a memory cell array while using a reduced voltage for other memory structures and interfacing devices may be accomplished by the use of level shifters to interface the components. For example, a "high" voltage differential with a low logic level of 0 V and a high logic level of 1.3 V may be used within a memory cell array while a high logic level of only 0.7 V may be used outside the array for other memory structures (e.g., support circuitry for/associated with the memory cell array such as address decoders and timing circuits) and interfacing devices (e.g., address and data busses.) A transition from the low to the higher voltage logic levels may be accomplished using level shifters. Level shifters convert the low voltage logic levels to the higher voltages required by the memory cells of a memory cell array. While reducing power requirements, incorporating these level shifters consumes additional energy to power the level shifters and requires additional area or space on a chip (e.g., chip substrate "real estate".) The level shifters may also introduce a delay in signal propagation time, skewing clock, control and data signals. Thus, the number and configuration of level shifters can affect memory size, timing and power requirements.

SUMMARY

According to an embodiment of the present disclosure a dual voltage semiconductor memory device includes write driver, a timing tracking circuit, a memory cells. The write drivers receive low voltage data input signals and, in response, write data values into a memory core. The timing tracking circuit delays a high voltage word line signal in accordance with a time associated with the write drivers writing data into the memory core. The memory cells are responsive to the high voltage word line signal and to the write drivers writing data values for storing data therein.

According to another embodiment, a semiconductor memory device includes address signal level shifters, a decoder, write drivers, and memory cells, The address level shifters transform low level address signals into higher level address signals. The decoder receives the higher level address signals and, in response, provides word line signals. The write drivers receive low level data input signals and, in response, write data values into bit lines. The memory cells are responsive to the word line signals and to the bit lines for storing data therein.

In yet another embodiment, a semiconductor memory device includes a substrate and address signal level shifters formed on the substrate. The level shifters transform low level address signals into higher level address signals. The memory device also includes a decoder formed on the substrate and configured to receive the higher level address signals and, in response, provide word line signals. The memory further includes data input terminals connecting to the substrate and configured to receive low level data signals. The memory also includes write drivers formed on the substrate, the write drivers receiving the low level data signals and, in response, writing data values. The memory also includes memory cells formed on the substrate, the memory cells responsive to the word line signals and to the written data values for storing data therein.

In still another embodiment, a method is provided for operating memory cells. The method includes driving a write signal onto bit lines connecting to memory cells based upon a low level data input signal; and shifting a level of an address signal from a low level to a higher level. The method also includes decoding the address signal to provide a word line signal activating selected ones of the memory cells; and shifting a level of an applied clock signal to provide a high level clock signal. The method further includes adjusting a timing of the high level clock signal to provide a delayed clock signal; and storing the write signal in selected ones of the memory cells from the bit lines in response to the delayed clock signal.

The foregoing has outlined rather broadly the features and technical advantages of the present invention in order that the detailed description that follows may be better understood. Additional features and advantages will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present disclosure, reference is now made to the following description taken in conjunction with the accompanying figures.

DETAILED DESCRIPTION

Figure 1:
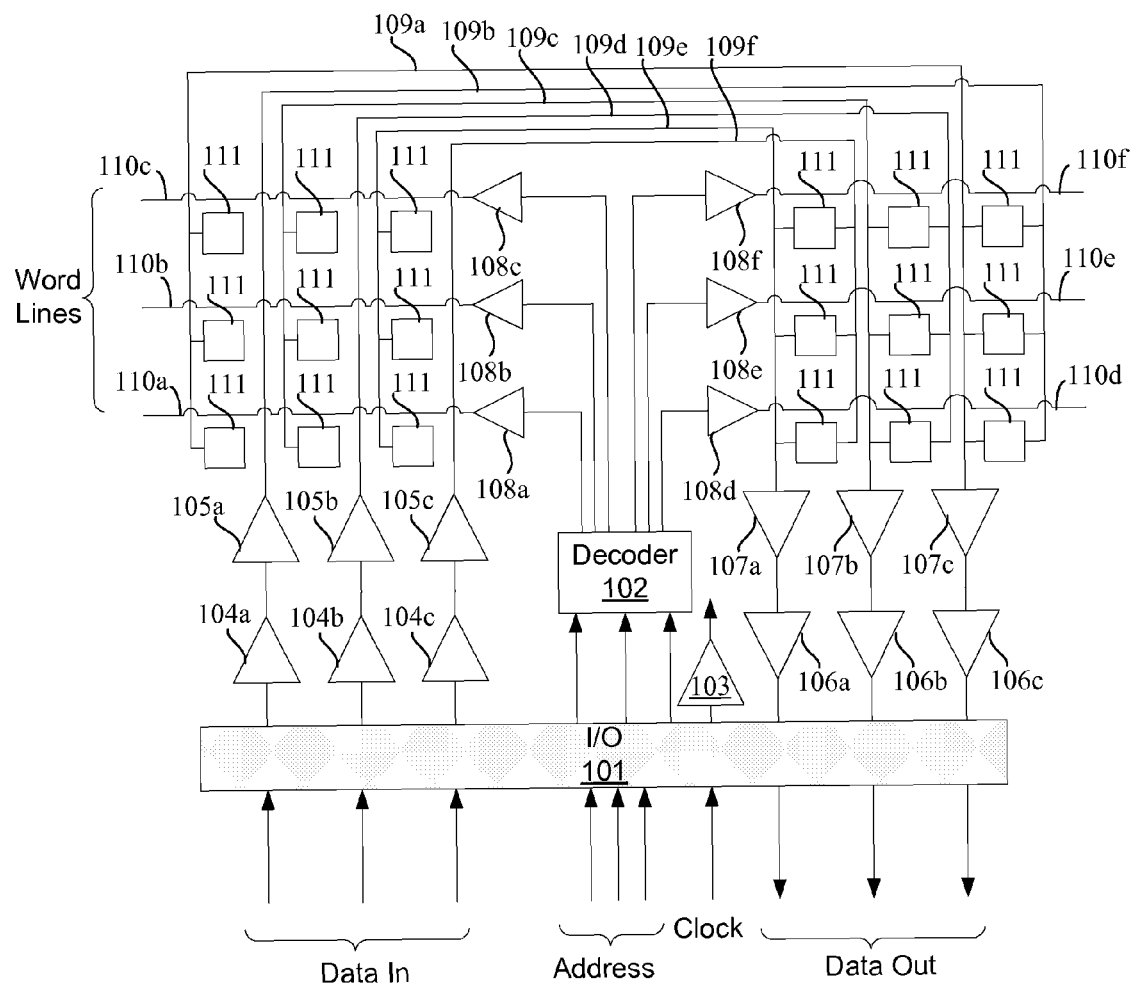
FIG. 1 is a block diagram of a conventional memory device including level shifters associated with respective word lines of a memory cell array.

FIG. 1 is a block diagram of a memory device including a conventional dual power scheme. Portions of memory circuitry (e.g., an Address Decoder) are operated at relativity low voltage levels (e.g., 0-0.7 V) whereas a memory cell array and sense amplifiers are operated at a higher voltage (e.g., 0-1.3 V.) Operating circuitry not requiring the high voltage levels (e.g., the Address Decoder) at a lower voltage reduces power consumption and heat generated. Thus, the higher 1.3 V high logic level is only used to store information in and operate the memory cells of the memory cell array as the higher voltage levels may be desirable to enhance the integrity of data storage and retrieval.

With reference to FIG. 1, the I/O circuit 101 receives and transmits relatively low voltage signals to and from the memory device including data-in ($D_{in}$), address (Addr) and clock (clk) signals applied to the I/O circuit and transmits low level data-out signals $D_{out}$ from the memory array to external devices (or other circuitry that might be integrated into a memory device or chip) receiving data. Data-in signals $D_{in}$ are level shifted from 0-0.7 V to a nominal higher voltage range of 0-1.3 V by the level shifters 104a-104c. The resultant level shifted $D_{in}$ signal is then supplied to the write drivers 105a-105c. The nominal 0-1.3 V $D_{in}$ signals from the write drivers 105a-105c are applied to the bit lines 109a-f and transmitted to the SRAM memory cells 111. Although only shown connected to the bit lines 109b, 109d, 109f, in fact the write drivers 105a-105c communicate with both the bit lines 109b, 109d, 109f, and the complementary bit lines 109a, 109c, 109e.

The low level address and clock signals Addr and clk are respectively transmitted through the I/O circuit 101 to the address decoder 102 and the clock level shifter 103. The decoder 102 is configured to accept the low voltage address signal Addr, decode it, select and provide an appropriate low level selection signal to the level shifters 108a-108f. The level shifters 108a-108f shift the logic levels of the low level (e.g., 0-0.7V) signal provided by the decoder 102 to an appropriate high level voltage output signal (e.g., nominally having a low logic level of 0 V and a high logic level of 1.3 V) corresponding to a selected word line 110a-110f.

Selected memory cells 111 connected or otherwise associated with an activated word line 10a-10f are enabled to write or store data into the selected memory cells from the bit lines 109a-f or, when operated in a read mode of operation, read information from the memory cell onto a corresponding bit line 109a-f. Because the decoder 102 provides a low voltage output selection signal to the memory array (e.g., having a high logic level of only 0.7 V), it is necessary to provide a level shifter for each of the word lines to obtain a higher voltage level (e.g., a signal having a nominal high logic level of 1.3 V). In general the number of level shifters required for an n-bit row address signal results in 2ⁿ level shifters associated with respective word lines. For example, a 16 megabit SRAM organized as one megabit words by 16 bits would include 10 address input lines and as many as one million individual word lines, each requiring a separate level shifter.

The level shifter 103 receives a low level clock signal clk from the I/O circuit 101 and provides the level shifted high voltage clock signal clk to components of the memory as required. High level output signals from selected memory cells 111 are provided to sense amplifiers 107a-107c which, in turn, provide outputs to following buffers 106a-106c to provide data output signal $D_{out}$ via the I/O circuit 101.

Figure 2:
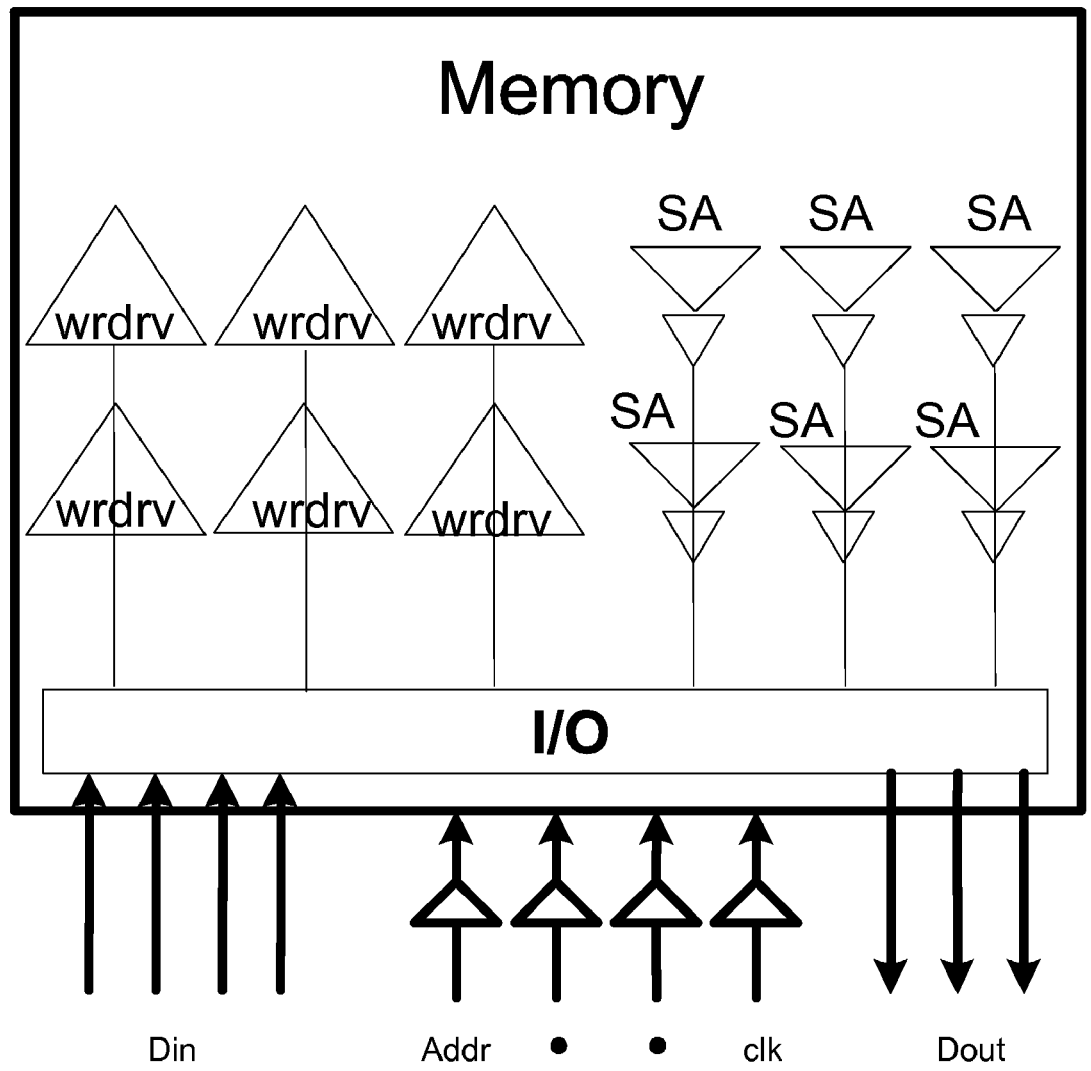
FIG. 2 is a high level block diagram of a dual voltage memory device having level shifters feeding decoder and timing circuits of a memory cell array.

FIG. 2 is a block diagram of a memory circuit implementing a reduced overhead dual power circuit including level shifters providing appropriate high voltage (e.g., 0-1.3 V) address and clock signals to the I/O section of a memory device thereby reducing the number and power consumption associated with level shifters associated with individual word lines. As shown, write drivers receive a data signal from an I/O circuit so as to write information into selected memory cells without the need for level shifters. A series of sense amplifiers SA provide a low level data output signal Dout from selected memory cells. In another embodiment, the sense amplifiers operate at high voltage and a following buffer operates at low voltage, as discussed below.

Note that, for purposes of the present explanation, single ported SRAM cells are depicted. Other types of memory cells may be substituted, for example dual ported memory. Similarly, while a specific memory architecture is depicted, other arrangements and configurations adopting a dual power or dual voltage scheme may be implemented. Likewise, while three bit data-in, data-out, and address signals are shown, typical configuration would incorporate many more bits of data and address information carried by different numbers of data, address and control signal lines.

Figure 3:
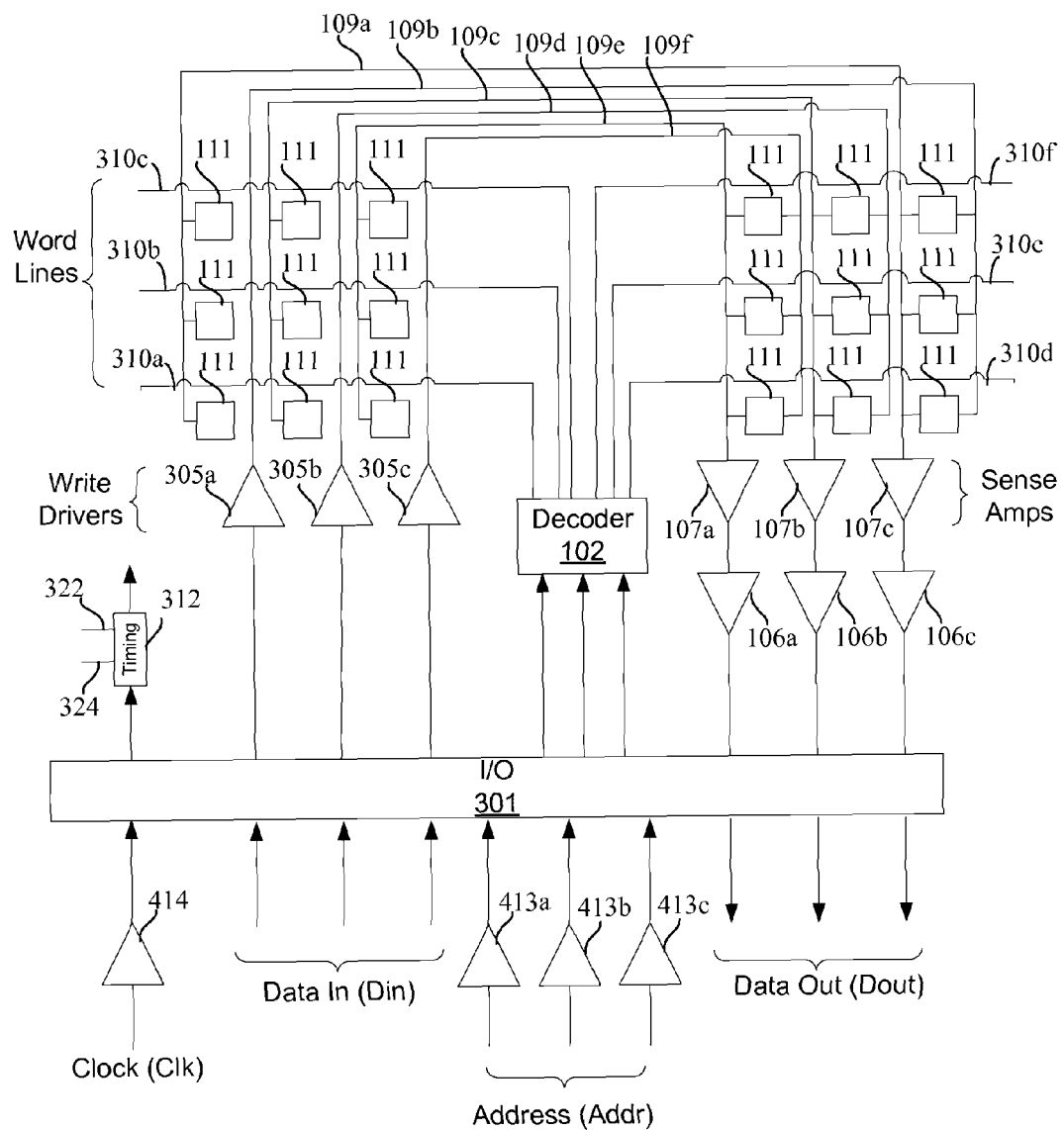
FIG. 3 is a more detailed block diagram of the dual voltage memory device depicted in FIG. 3.

FIG. 3 is a more detailed block diagram depicting a dual voltage memory circuit implementing a reduced overhead dual power scheme to provide dynamic power saving while reducing memory size. In particular, the embodiment depicted in FIG. 3 provides a common level shifting functionality for signals applied to an I/O circuit 301 to avoid the need for multiple level shifters associated with individual word lines. By level shifting the low level address signals prior to or as part of the I/O circuit 301, fewer components are required to support the dual power scheme, thereby reducing space requirements i.e., "chip real estate" necessary to interface with relatively low level voltages used by components outside of the memory array itself.

With reference to FIG. 3, address and clock signals Addr and clk are applied to the level shifters 313a-313c and 314 respectively so as to convert low voltage logic levels (e.g., 0-0.7V) to high level logic signals (e.g., 0-1.3V) to be applied to the I/O circuit 301. The high level signals are then supplied to the decoder 302 and a timing tracking circuit 312. The decoder 102 decodes the address signal Addr to selectively activate the word lines 310a-310f by applying an appropriate high level memory cell select signal to the appropriate word line. As before, the memory cells 111 are operated at the higher voltages (0-1.3 V) to maintain data integrity.

$D_{in}$ is a low voltage signal supplied via the I/O circuit 301 directly to write drivers 305a-305c without the need for distinct level shifters (compare with the configuration of FIG. 2). The write drivers 305a-305c provide appropriately timed signals to the bit lines 109a-f for writing information into the memory cells 111 of the memory cell array. Although only shown connected to the bit lines 109b, 109d, 109f, in fact the write drivers 305a-305c communicate with both the bit lines 109b, 109d, 109f, and the complementary bit lines 109a, 109c, 109e to discharge either the bit lines or complementary bit lines based upon the signal being written.

Because of possible delays in providing the data from the write drivers 305a-305c onto the bit lines 109a-f, the timing circuit 312 properly synchronizes the clock signal clk. Synchronization may include delaying or gating a clock signal to accommodate the speed of the low voltage level write drivers 305a-305c writing data into the memory cells. That is, because the write drivers 305a-305c are driven by a low voltage signal, an increased response time may result prior to discharging the appropriate bit lines to write the desired value. To accommodate this timing issue, the timing tracking circuit 312 may receive various inputs including inputs 322 and 324 to appropriately gate write enable, and if necessary read enable signals, to the various memory cells 111. The inputs 322 and 324 originate from each power domain (one signal from the high power domain and one signal from the low power domain). Because the word line path is at high voltage and the Din path is at low voltage, one signal from each domain facilitates control of the timing between the two power domains.

Information may be retrieved or read from the memory cells 111 in a similar fashion. That is, an address signal Addr designating the addresses of the memory cells 111 to be accessed is applied to the level shifters 313a-313c. Note that, for purposes of the present example, although a three-bit wide address signal is shown together with corresponding level shifters 313a-313c, typically an address signal would have many more parallel bits of address data depending on memory size and configuration, e.g., 10 bits of address may be used to provide access to one million words (or other addressable unit) of memory. Similarly, although $D_{in}$ and $D_{out}$ are shown to be three bits wide each, typically such signals would be substantially wider, e.g., 16, 32 or 64 bit wide signals.

In response to the address signal, the decoder 102 provides appropriate selection signals onto a selected word line 310a-310f to access (e.g., enable) the corresponding memory cells 111 for storage or retrieval of data thereto or therefrom. In a read mode of operation, data from the memory cells 111 is transmitted by the bit lines 109a-f to the sense amps 107a-107c and thereupon to the following buffers 106a-106c. Although not depicted in the drawings for the sake of clarity, it will be appreciated that the sense amplifiers 107a-107c communicate with both the bit lines and complementary bitlines.

The following buffers 106a-106c operate at lower voltage levels, providing an appropriate low level (e.g., 0-0.7 V) $D_{out}$ signal to an external device. In an alternative embodiment, both the sense amplifiers 107a-107c and following buffers 106a-106c operate at low voltage. Although, for purposes of illustration and explanation, a single set of bit lines may be used for both reading from and writing to the memory cells 111 of the memory cell array, separate write and read bit lines can be used instead.

Figure 4:
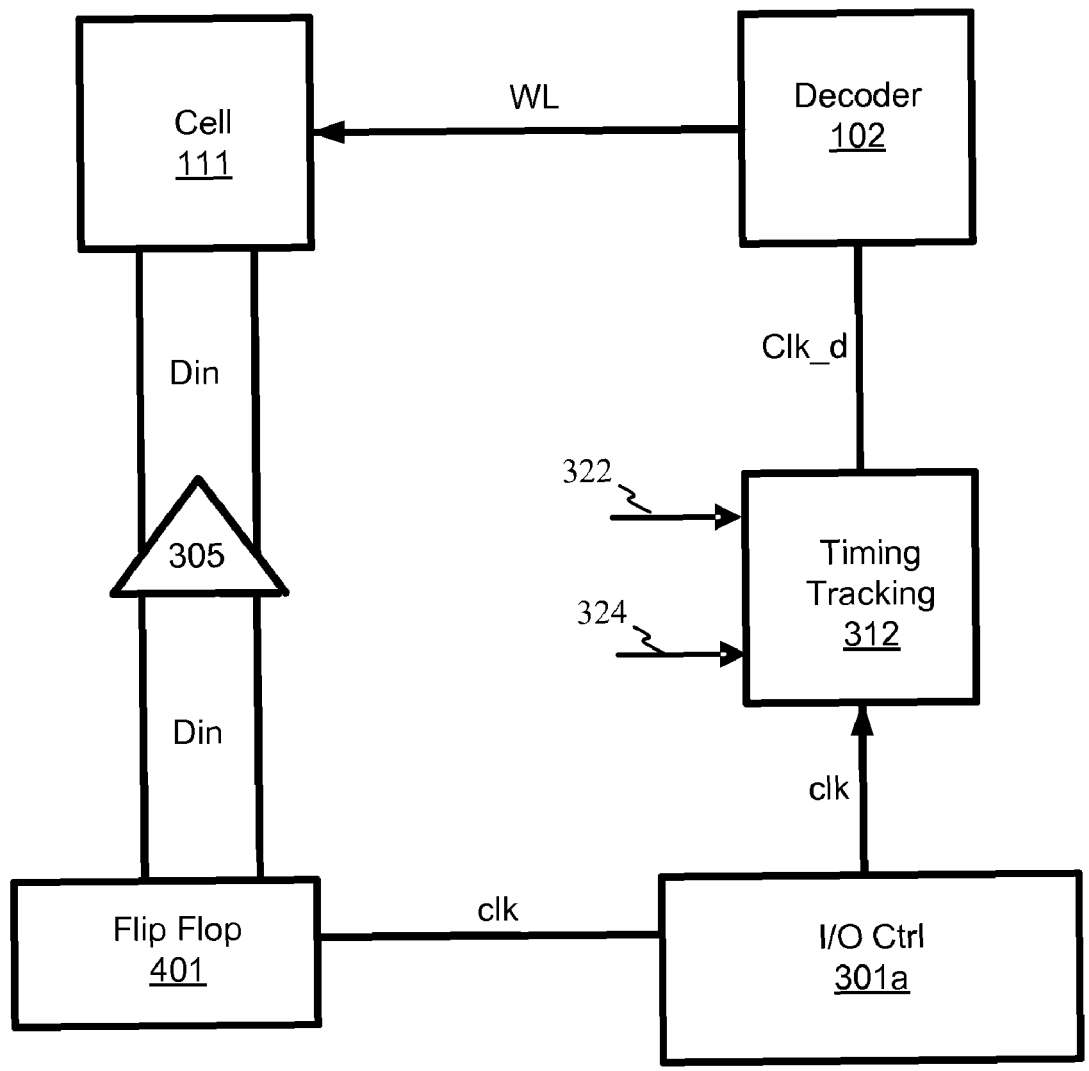
FIG. 4 is a block diagram depicting a timing tracking circuit as part of a dual voltage memory device as depicted in FIG. 4.

FIG. 4 is a block diagram of a dual voltage memory circuit implementing a reduced overhead dual power scheme including the timing tracking circuit 312. In particular, a data-in signal provided by the I/O circuit 301 (see FIG. 3) is a low level signal driving the write drivers 305a-305c. As previously described, a delay may be experienced in provision of appropriate data onto the respective bit lines 109a-f, due to the low level driving of the write drivers 305a-305c. The word line WL, however, should be enabled after the write operation has been completed by the write drivers 305a-305c. The word line enable signal is in the high power domain, and thus should be delayed. To create the delay, the timing tracking circuit 312, which receives clock signals clk from I/O ctrl (a portion on the I/O circuit 301), may delay the application of the appropriate word line WL select signal from the decoder 102 by providing it with a delayed clock signal clk_d. The timing tracking circuit 312 may be responsive to one or both of low level signals 322 and high level signals 324 to provide the appropriate timing of clock signal clk_d.

Operation of the timing tracking is now explained. A flip flop (401) (or a latch) latches data from outside of the memory, and in response to a clock signal received from the I/O circuit 301 (more specifically a portion of the I/O circuit 301 referred to as the I/O ctrl 301a) forwards the latched data to the write driver 305, The write driver 305 then gets ready to write the latched data into a memory cell 111. The timing tracking circuit 312 delays the decoder path to match the delay of the Din path by generating a delayed clock signal clk_d. The word line (WL) path is faster because it is high voltage and the Din path is slower because it is low voltage. The timing tracking circuit 312 tracks timing of the Din path based upon the input 322. Because the decoder 102 is delayed relative to the write driver 305, the data is ready to write before the word line WL is enabled by the decoder 102.

Figure 5:
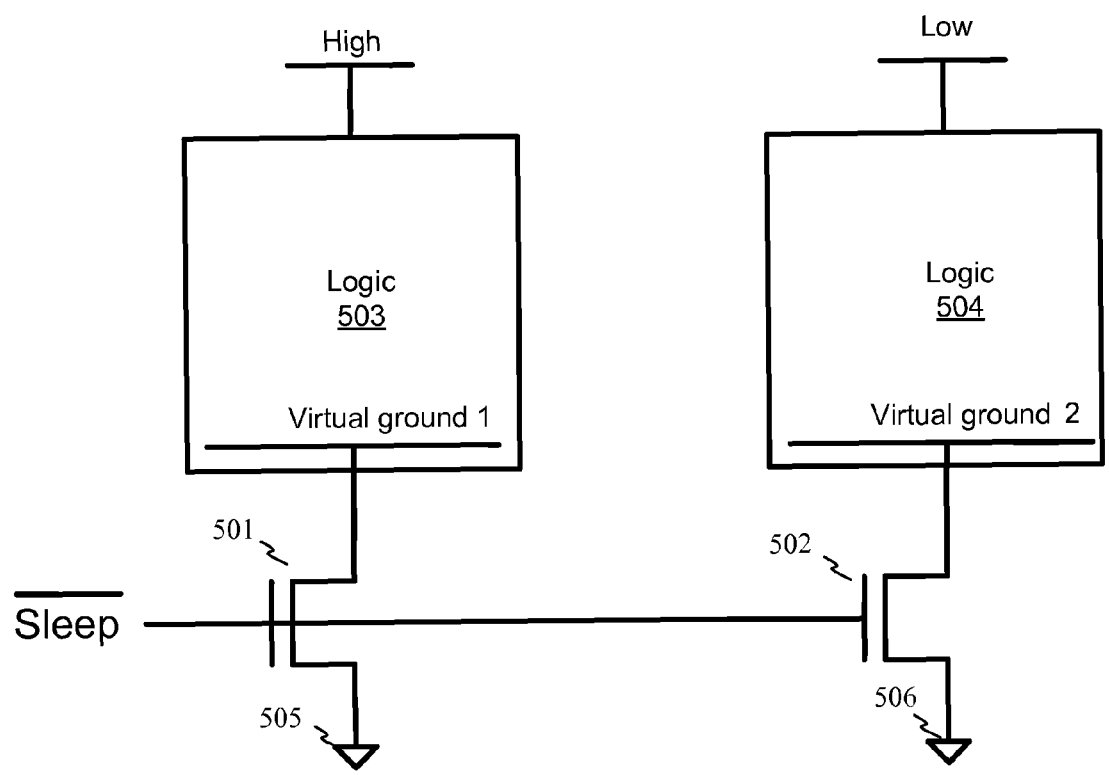
FIG. 5 is a schematic diagram of a pair of foot switches connected in a ground return path of respective portions of a dual voltage memory device.

The timing tracking circuit can also track the timing variation caused by voltage fluctuation. In one embodiment, the low level signal 322 comes from the Din path (in the low power domain) and the high level signal 324 comes from a high FIG. 5 is a block diagram of a pair of "foot switches" 501 and 502, each controlling respective high and low voltage portions 503 and 504, respectively, of a memory so as to selectively place the memory in an operational mode or a standby or "sleep" mode. Each foot switch 501, 502 selectively interrupts a connection to a virtual ground 505, 506 for the associated portion 503, 504 of memory. Two different virtual grounds are provided because the operational voltages in the different power domains differ. As previously described, the memory cell array and, according to an embodiment of the invention, the decoder, are operated at a high voltage level and are thereby controlled by the foot switch 501 to selectively place that logic in either an operational or sleep mode in response to a mode signal Sleep. Similarly, low voltage level circuitry including, for example, the write drivers 305a-305c and following buffers 106a-106c are selectively operated in an operational or sleep mode of operation response to a state of switch 502. The sleep mode provides reduced current leakage.

Figure 6:
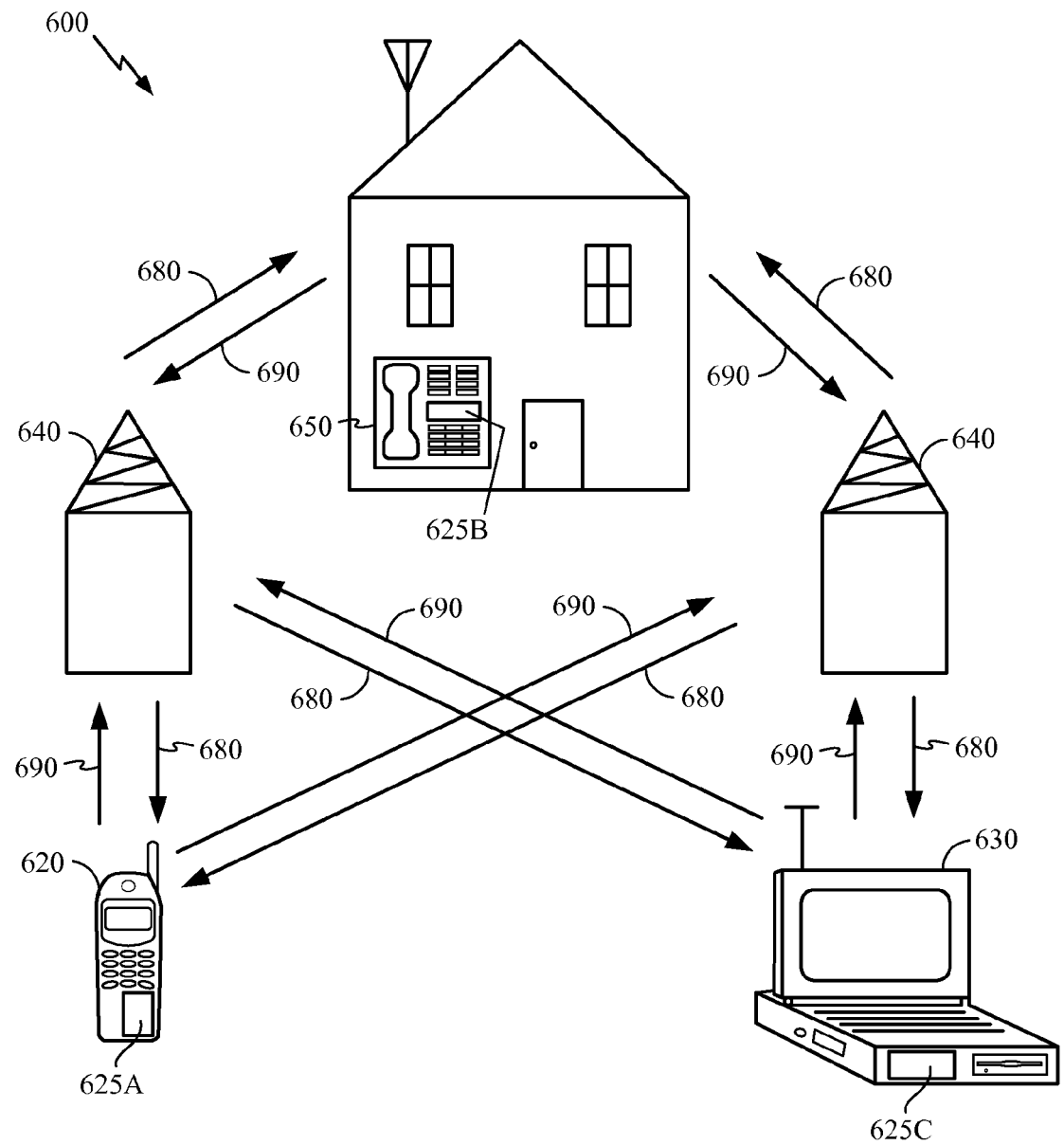
FIG. 6 is a block diagram showing an exemplary wireless communication system in which an embodiment of the invention may be advantageously employed.

FIG. 6 shows an exemplary wireless communication system 600 in which an embodiment of the invention may be advantageously employed. For purposes of illustration, FIG. 6 shows three remote units 620, 630, and 650 and two base stations 640. It will be recognized that typical wireless communication systems may have many more remote units and base stations. Remote units 620, 630, and 650 include dual power memory circuits 625A, 625B, and 625C, respectively, which are embodiments of the invention as discussed above. FIG. 6 shows forward link signals 680 from the base stations 640 and the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 6 illustrates remote units according to the teachings of the invention, the invention is not limited to these exemplary illustrated units. The invention may be suitably employed in any device which includes a dual power memory circuit.

Features of the various dual voltage memory circuits provide advantages over alternative arrangements. For example, use of a foot switch including separate switching elements for high and low voltage circuitry results in a decreased leakage current during standby or sleep mode of operation. The use of low voltage write drivers may eliminate the need for separate level shifters, reducing chip area and further reducing power requirements. Providing level shifters at the input to the I/O circuitry reduces the number of level shifters that might otherwise be required in other arrangements such as when instead supplied at the output of an address decoder. Still another advantage according to features of the described memory configurations results from sense amplifiers that provide a low output voltage level thereby reducing power consumption during read operations and minimizing power losses that might otherwise result from driving high voltages onto long metal interconnect lines on a chip (e.g., an output bus).

Although specific circuitry has been set forth, it will be appreciated by those skilled in the art that not all of the disclosed circuitry is required to practice the invention. Moreover, certain well known circuits have not been described, to maintain focus on the invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A dual voltage semiconductor memory device comprising:
    a plurality of write drivers receiving low voltage data input signals;
    a plurality of bit lines in communication with the plurality of write drivers, the plurality of write drivers configured to write the low voltage data input signals to the plurality of bit lines in response to receiving the low voltage data input signals;
    a timing tracking circuit configured to delay a high voltage word line signal in accordance with a time associated with the plurality of write drivers writing the low voltage data input signals; and
    a plurality of memory cells responsive to the high voltage word line signal and to the plurality of write drivers writing the low voltage data input signals.

2. The dual voltage semiconductor memory device according to claim 1 further comprising:
    a plurality of address signal level shifters configured to transform low voltage address signals into high voltage address signals; and
    a decoder configured to receive the high voltage address signals and, in response, provide high voltage word line signals, wherein the plurality of memory cells receive the high voltage word line signals thereby designating ones of the memory cells selected to have data stored therein.

3. The dual voltage semiconductor memory device according to claim 1 in which the timing tracking circuit receives a low voltage signal and a high voltage signal to enable calculation of a duration of the delay.

4. The dual voltage semiconductor memory device according to claim 1 further comprising:
    a low voltage foot switch including a first switching element selectively connecting low voltage elements of the dual voltage semiconductor memory device to a first virtual ground; and
    a high voltage foot switch including a second switching element selectively connecting high voltage elements of the dual voltage semiconductor memory device to a second virtual ground.

5. The dual voltage semiconductor memory device of claim 1, in which the dual voltage semiconductor memory device is integrated into a device, selected from the group consisting of a set top box, music player, video player, entertainment unit, navigation device, communications device, personal digital assistant (PDA), fixed location data unit, microprocessor and a computer.

6. A semiconductor memory device comprising:
    a plurality of address signal level shifters configured to transform low level address signals into higher level address signals;
    a decoder configured to receive the higher level address signal and, in response, provide high level word line signals;
    a plurality of write drivers receiving low level data input signals;
    a plurality of bit lines in communication with the plurality of write drivers, the plurality of write drivers configured to write the low level data input signals to the plurality of bit lines in response to receiving the low level data input signals; and
    a plurality of memory cells responsive to the high level word line signals and to the bit lines receiving the low level data input signals.

7. The semiconductor memory device according to claim 6, further comprising a plurality of sense amplifiers selectively connected to the memory cells and responsive to data stored therein for providing data output signals.

8. The semiconductor memory device according to claim 6, further comprising:
    a timing tracking circuit configured to control timing of the high level word line signals to compensate for a delay in writing the low voltage data input signals.

9. The semiconductor memory device according to claim 8, further comprising:
    a clock signal level shifter configured to transform a low level clock signal into a higher level clock signal, the timing tracking circuit providing an appropriate delay of the higher level clock signal to compensate for the delay in the write drivers writing the low voltage data input signals.

10. The semiconductor memory device according to claim 8, further comprising a high voltage input to the timing tracking circuit.

11. The semiconductor memory device according to claim 8 further comprising a low voltage input to the timing tracking circuit.

12. The semiconductor memory device according to claim 6, further comprising:
a substrate; and
a plurality of data input terminals connecting to the substrate and configured to receive the low level data input signals and the low level address signals and supply corresponding signals to the plurality of write drivers, the address signal level shifters, the decoder, and the plurality of memory cells formed on the substrate.

13. The semiconductor memory device according to claim 6, further comprising:
a high power foot switch circuit configured to selectively interrupt a connection to a first virtual ground of high voltage components of the semiconductor memory device; and
a low power foot switch circuit configured to selectively interrupt a connection to a second virtual ground of low voltage components of the semiconductor memory device,
the high power foot switch circuit and the low power foot switch circuit responsive to a common sleep signal for selectively operating the semiconductor memory device in active and standby modes of operations.

14. The semiconductor memory device according to claim 6, further comprising an input/output circuit configured to transmit the high level address signal to the decoder and transmit the low level data input signals to the write drivers.

15. The semiconductor memory device of claim 6, in which the semiconductor memory device is integrated into a device, selected from the group consisting of a set top box, music player, video player, entertainment unit, navigation device, communications device, personal digital assistant (PDA), fixed location data unit, microprocessor and a computer.

16. A semiconductor memory device comprising:
a substrate;
a plurality of address signal level shifters formed on the substrate, the level shifters configured to transform low level address signals into higher level address signals;
a decoder formed on the substrate and configured to receive the higher level address signals and, in response, provide high level word line signals;
a plurality of data input terminals connecting to the substrate and configured to receive low level data signals;
a plurality of write drivers formed on the substrate, the write drivers receiving the low level data signals;
a plurality of bit lines in communication with the plurality of write drivers, the plurality of write drivers configured to write the low level data signals to the plurality of bit lines in response to receiving the low level data signals; and
a plurality of memory cells formed on the substrate, the memory cells responsive to the high level word line signals and to the plurality of write drivers writing the low level data signals.

17. The semiconductor memory device of claim 16, in which the semiconductor memory device is integrated into a device, selected from the group consisting of a set top box, music player, video player, entertainment unit, navigation device, communications device, personal digital assistant (PDA), fixed location data unit, microprocessor and a computer.

18. A method of operating a plurality of memory cells comprising:
driving a write signal via a plurality of write drivers onto a plurality of bit lines connecting the plurality of write drivers to memory cells based upon a low level data input signal;
shifting a level of an address signal from a low level to a higher level;
decoding the higher level address signal to provide a high level word line signal activating selected ones of the memory cells;
shifting a level of an applied clock signal to provide a high level clock signal;
adjusting a timing of the high level clock signal to provide a delayed clock signal; and
storing the write signal in selected ones of the memory cells from the plurality of bit lines in response to the delayed clock signal.

19. The method according to claim 18, further comprising:
selecting a plurality of memory cells to be read; sensing data stored in the selected memory cells; and
providing a data output signal.

20. The method according to claim 18 further wherein the adjusting includes compensating for a delayed availability of the write signal.

21. The method according to claim 18 further comprising:
selectively interrupting a connection to a first virtual ground of low voltage level memory components; and
selectively interrupting a connection to a second virtual ground of high voltage level memory components, so as to selectively operate a semiconductor memory device in active and standby modes of operations.

22. The plurality of memory cells, according to the method of claim 18, integrated into a device, selected from the group consisting of a set top box, music player, video player, entertainment unit, navigation device, communications device, personal digital assistant (PDA), fixed location data unit, microprocessor and a computer.

23. A dual voltage semiconductor memory device comprising:
a plurality of bit lines;
write driver means for receiving the low voltage data input signals and for writing low voltage data input signals to the plurality of bit lines in response to receiving the low voltage data input signals, the write driver means being in communication with the plurality of bit lines;
means for delaying a high voltage word line signal in accordance with a time associated with the write driver means writing the low voltage data input signals; and
means for storing data responsive to the high voltage word line signal, the storing means responsive to the write driver means writing the low voltage data input signals.

24. The dual voltage semiconductor memory device of claim 23, in which the dual voltage semiconductor memory device is integrated into a device, selected from the group consisting of a set top box, music player, video player, entertainment unit, navigation device, communications device, personal digital assistant (PDA), fixed location data unit, microprocessor and a computer.

25. A semiconductor memory device comprising:
means for transforming low level address signals into higher level address signals;
means for receiving the higher level address signals and, in response, providing high level word line signals;

a plurality of bit lines;

write driver means for receiving the low voltage data input signals and for writing low voltage data input signals to the plurality of bit lines in response to receiving the low voltage data input signals, the write driver means being in communication with the plurality of bit lines; and means for storing data responsive to the high level word line signals, the storing means responsive to the plurality of bit lines receiving the low level data input signals.

26. The semiconductor memory device of claim 25, in which the semiconductor memory device is integrated into a device, selected from the group consisting of a set top box, music player, video player, entertainment unit, navigation device, communications device, personal digital assistant (PDA), fixed location data unit, microprocessor and a computer.

27. A semiconductor memory device comprising:

a substrate;

means for transforming low level address signals into higher level address signals, the transforming means being formed on the substrate;

means for decoding the higher level address signals into high level word line signals, the decoding means being formed in the substrate;

means for receiving low level data signals, the receiving means connecting to the substrate;

a plurality of bit lines;

write driver means for receiving the low voltage data input signals and for writing low voltage data input signals to the plurality of bit lines in response to receiving the low voltage data input signals, the write driver means being in communication with the plurality of bit lines; and means for storing data formed on the substrate, the data storing means responsive to the high level word line signals and to the write driver means writing the low level data signals.

28. The semiconductor memory device of claim 27, in which the semiconductor memory device is integrated into a device, selected from the group consisting of a set top box, music player, video player, entertainment unit, navigation device, communications device, personal digital assistant (PDA), fixed location data unit, microprocessor and a computer.

29. A semiconductor memory device comprising:

a plurality of bit lines;

write driver means for driving a write signal onto the plurality of bit lines based upon a low level data input signal, the plurality of bit lines connecting the write driver means to data storage means;

means for shifting a level of an address signal from a low level to a higher level;

means for decoding the higher level address signal into a high level word line signal for activating selected ones of the data storage means;

means for shifting a level of an applied clock signal to provide a high level clock signal;

means for adjusting a timing of the high level clock signal to provide a delayed clock signal; and means for storing the write signal in selected ones of the data storage means from the plurality of bit lines in response to the delayed clock signal.

30. The plurality of memory cells, according to the method of claim 29, integrated into a device, selected from the group consisting of a set top box, music player, video player, entertainment unit, navigation device, communications device, personal digital assistant (PDA), fixed location data unit, microprocessor and a computer.

* * * * *